United States Patent
Li et al.

(10) Patent No.: US 7,980,297 B2
(45) Date of Patent: Jul. 19, 2011

(54) HEAT SINK HAVING PROTECTIVE DEVICE FOR THERMAL INTERFACE MATERIAL SPREAD THEREON

(75) Inventors: Dong-Yun Li, Shenzhen (CN); Jing Zhang, Shenzhen (CN); Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 931 days.

(21) Appl. No.: 11/850,824

(22) Filed: Sep. 6, 2007

(65) Prior Publication Data

US 2009/0067133 A1    Mar. 12, 2009

(51) Int. Cl.
*H05K 7/20* (2006.01)
(52) U.S. Cl. .......................... 165/185; 361/705
(58) Field of Classification Search .......... 165/80.3, 165/185; 361/704, 705
See application file for complete search history.

(56) References Cited

U.S. PATENT DOCUMENTS
6,049,458 A    4/2000  Lee et al.

FOREIGN PATENT DOCUMENTS
CN    2662450    12/2004
TW    358565    5/1999

*Primary Examiner* — Allen J Flanigan
(74) *Attorney, Agent, or Firm* — Jeffrey T. Knapp

(57) ABSTRACT

A protective device (10) for protecting thermal interface material (30) spread on a central surface (512) of a bottom of a base (51) of a heat sink (50). The device includes a case (12) and a tab (18) extending from an edge of the case. The heat sink (50) has air channels (552) extending vertically therethrough and around the base. The case comprises an annular frame (120) and a cap (15) protruding downwardly from inside edges of the frame. The cap covers the thermal interface material. The frame is attached to the heat sink around the thermal interface material. The frame blocks portions of the air channels adjacent to the base, thereby to prevent dust or foreign particles from contaminating the thermal interface material through the air channels.

18 Claims, 5 Drawing Sheets

HEAT SINK HAVING PROTECTIVE DEVICE FOR THERMAL INTERFACE MATERIAL SPREAD THEREON

BACKGROUND OF THE INVENTION

1. Field of the Invention

The present invention relates generally to a protective device, and particularly to a cover for a heat sink to protect thermal interface material spread on the heat sink from contamination before the heat sink is assembled to a CPU or CPU module.

2. Description of Related Art

Electronic devices such as central processing units (CPUs) generate a lot of heat during normal operation. If the heat generated by the electronic devices is not properly dissipated, it can deteriorate their operational stability and damage associated electronic devices. Thus the heat must be quickly and efficiently removed to ensure the normal operation of these electronic devices. As shown in FIG. 5, a heat dissipation device 95a is used to be attached onto a top surface of a CPU (not shown) to remove heat therefrom. Thermal interface material 93a, such as thermal grease, is spread on a bottom of the heat dissipation device 95a. The thermal interface material 93a is used to fill gaps between the heat dissipation device 95a and the CPU. The thermal interface material 93a is used to ensure that the heat dissipation device 95a has an intimate contact with the CPU. A grease cover 90a is attached to the bottom of the heat dissipation device 95a to cover the thermal interface material 93a. Accordingly, during transportation, dust will not contaminate the thermal interface material 93a. However, air channels 952a which are formed between fins 950a of the heat dissipation device 95a still communicate the bottom of the heat dissipation device 95a with ambient air around the heat dissipation device 95a. Accordingly the thermal interface material 93a is easily to be contaminated by dust or foreign particles through the air channels 952a; when this happens, heat transfer performance of the thermal interface material 93a is deteriorated.

What is needed, therefore, is a protective device which can totally prevent dust or foreign particles from contaminating thermal interface material spread on a heat dissipation device.

SUMMARY OF THE INVENTION

A protective device for protecting thermal interface material spread on a heat sink includes a case and a tab extending outwardly from an edge of the case. The tab is devised for facilitating detachment of the protective device from the heat sink. The heat sink has air channels extending through a periphery of a bottom face of the heat sink. The thermal interface material is spread on a center of the bottom face of the heat sink. The case comprises an annular frame and a cap protruding downwardly from inside edges of the frame. When the protective device is mounted to a bottom of the heat pipe, the cap is positioned corresponding to the thermal interface material and enclosing the thermal interface material therein for protecting it from being contaminated by dust or foreign particles. The frame is attached to the heat sink around the thermal interface material. The frame contacts a portion of the bottom face of the heat sink around the thermal interface material and through which the channels extend, whereby portions of the air channels neighboring the thermal interface material are blocked by the frame. Thus, the dust and foreign particles cannot enter a space defined by the cap through the air channels to contaminate the thermal interface material. The frame has flanges extending upwardly from outer edges of the frame for engaging with the heat sink, to thereby help the mounting of the protective device to the bottom of the heat sink.

Other advantages and novel features of the present invention will become more apparent from the following detailed description of the preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
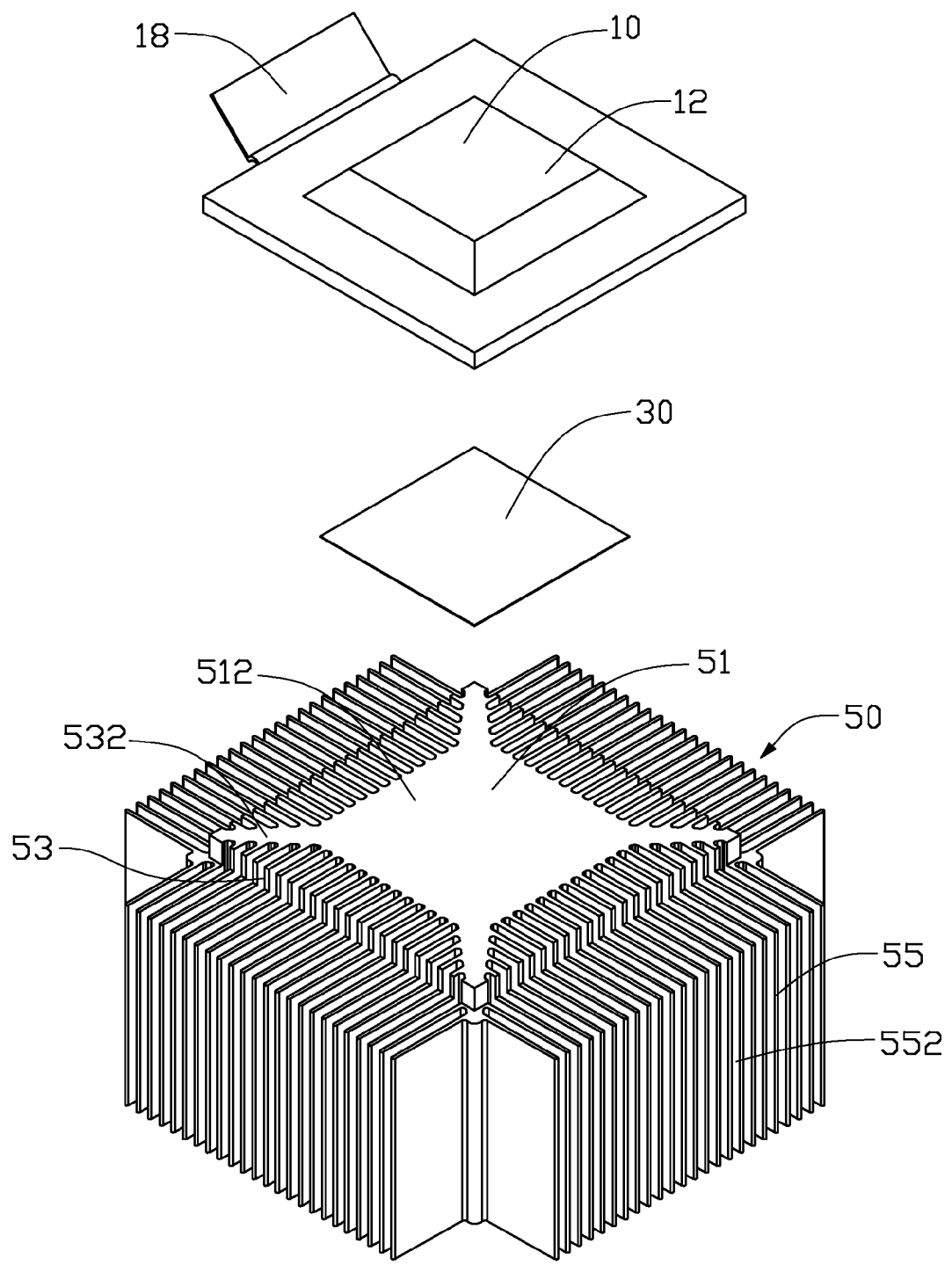
FIG. 1 is an isometric view of a protective device according to a preferred embodiment of the present invention, together with a heat sink and a thermal interface material.

Referring to FIG. 1, a protective device 10 in accordance with a preferred embodiment of the present invention, a thermal interface material 30 and a heat sink 50 are shown. The heat sink 50 is used for absorbing heat generated by an electronic component (not shown), such as a CPU. The protective device 10 is used to be attached to a bottom of the heat sink 50 and enclose the thermal interface material 30, such as a thermal grease, spread on the bottom of the heat sink 50. The protective device 10 is made of plastic. The protective device 10 comprises a cap-shaped case 12 and a tab 18 extending outwardly from an edge of the case 12. The tab 18 may serve as a handle to detach the protective device 10 from the heat sink 50.

Figure 2:
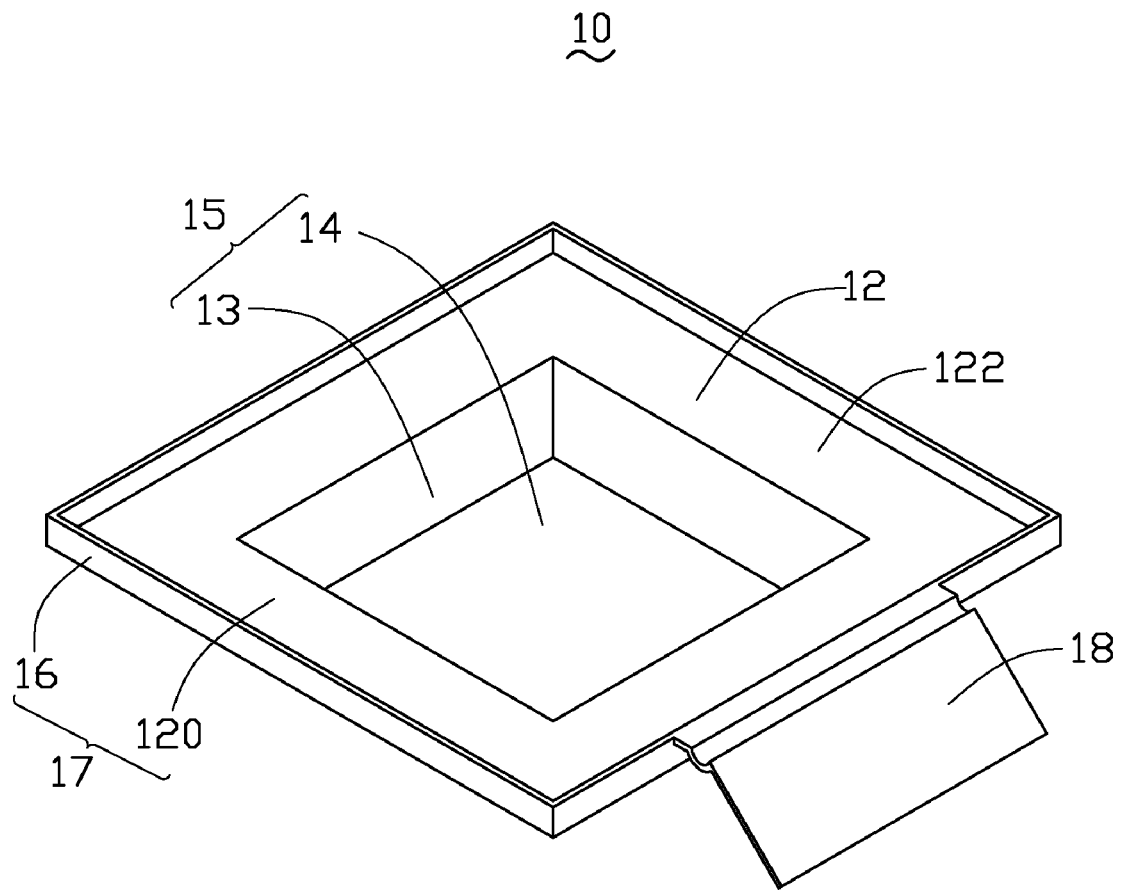
FIG. 2 is an enlarged, isometric view of the protective device in FIG. 1, viewed from another aspect.

Referring to FIG. 2, the case 12 of the protective device 10 comprises a quadrilateral frame 120 configured by four plane sides 122. Four sloping walls 13 respectively extend downwardly from inside edges of the plane sides 122. The sloping walls 13 cooperate with a bottom board 14 to form a cap 15 in a central area of the case 12. Four straight flanges 16 respectively extend perpendicularly from outside edges of the plane sides 122. The straight flanges 16 and the frame 120 cooperatively form a cover 17. The tab 18 extends outwardly from one of the straight flanges 16 and orients to a lateral side of the case 12.

The heat sink 50 comprises a base 51 having a shape like a square prism and a plurality of fins 55 extending outwardly from peripheries of the base 51 for dissipating heat of the base 51 to ambient air. A plurality of air channels 552 is formed between the fins 55. The air channels 552 vertically extend through top and bottom of the heat sink 50. A square platform 53 protrudes downwardly on the bottom of the heat sink 50. The platform 53 has a central surface 512 defining a bottom surface of the base 51 and a peripheral surface 532 formed by corresponding bottom surfaces of the fins 55 of the platform 53 and positioned around the base 51. The central surface 512 of the base 51 is adopted to contact with the electronic component. The thermal interface material 30 is spread on the central surface 512 of the base 51 and used to fill gaps between the central surface 512 and a top surface (not shown) of the electronic component with which the central surface 512 engages. An area of the peripheral surface 532 of the platform 53 is equal to or a little smaller than an area covered by the cover 17. An area of the central surface 512 of the base 51 is equal to or a little larger than an area covered by the cap 15 of the case 12. Also, the frame 120 can be other shape according to the shape of the base 51.

Figure 3:
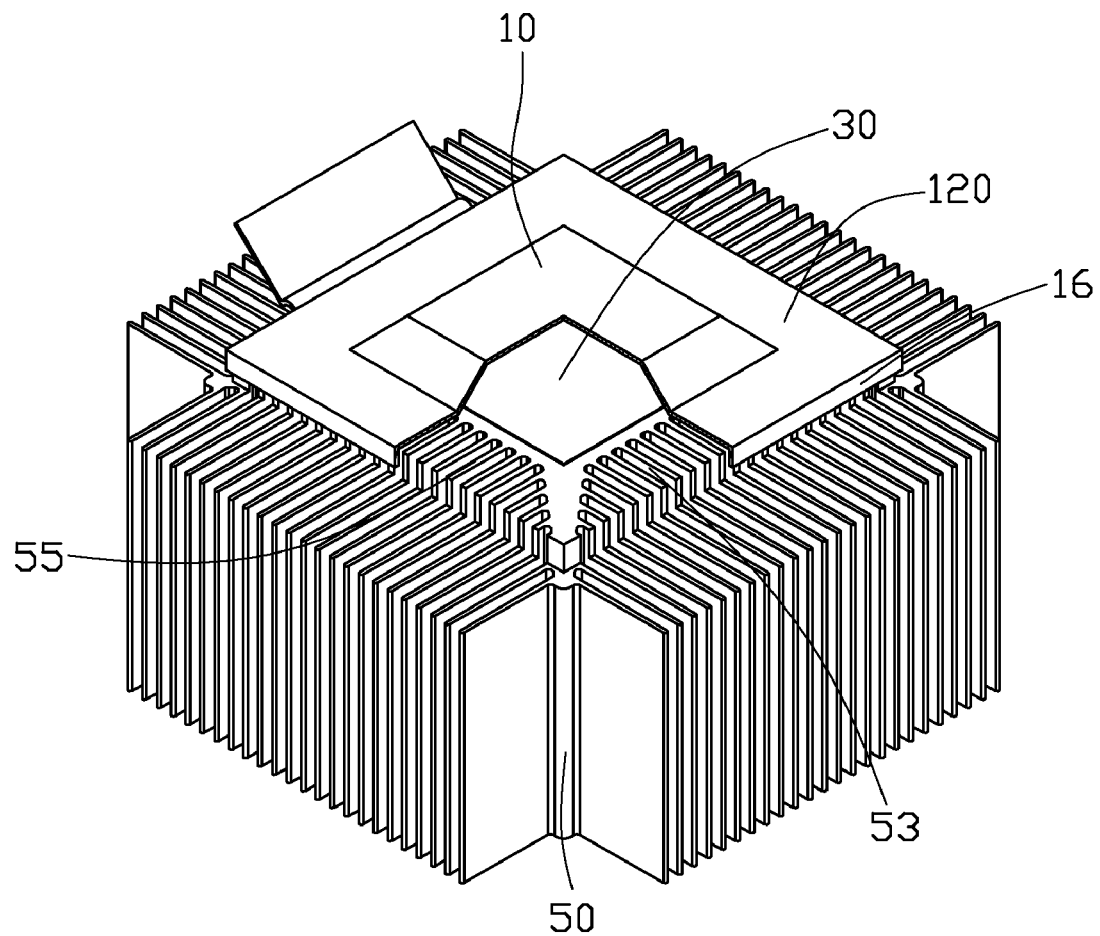
FIG. 3 is an assembled, isometric view of FIG. 1, wherein the protective device is partially cut away.

In assembly, referring to FIG. 3, the protective device 10 is disposed on the bottom of the heat sink 50. The cover 17 of the protective device 10 is aligned with the peripheral surface 532 of the platform 53; the straight flanges 16 engage on lateral sides of the platform 53; thus, the cover 17 is attached to the heat sink 50. Meanwhile, the plane sides 122 of the frame 120 extend over the peripheral surface 532 of the fins 55 and cover portions of the air channels 552 of the fins 55 through the platform 53 and around the base 51. Moreover, the cap 15 of the case 12 is located corresponding to the base 51 and encloses the thermal interface material 30 on the base 51. Thus, dust or foreign particles in the ambient air are obstructed to flow into a space defined by the cap 15 through the air channels 552 so that the thermal interface material 30 can be prevented from contamination. Furthermore, a releasable adhesive can be applied on a top surface of the frame 120 to adhere the frame 120 to the peripheral surface 532, whereby the air channels 552 can be more effectively and reliably blocked by the frame 120 of the protective device 10.

Figure 4:
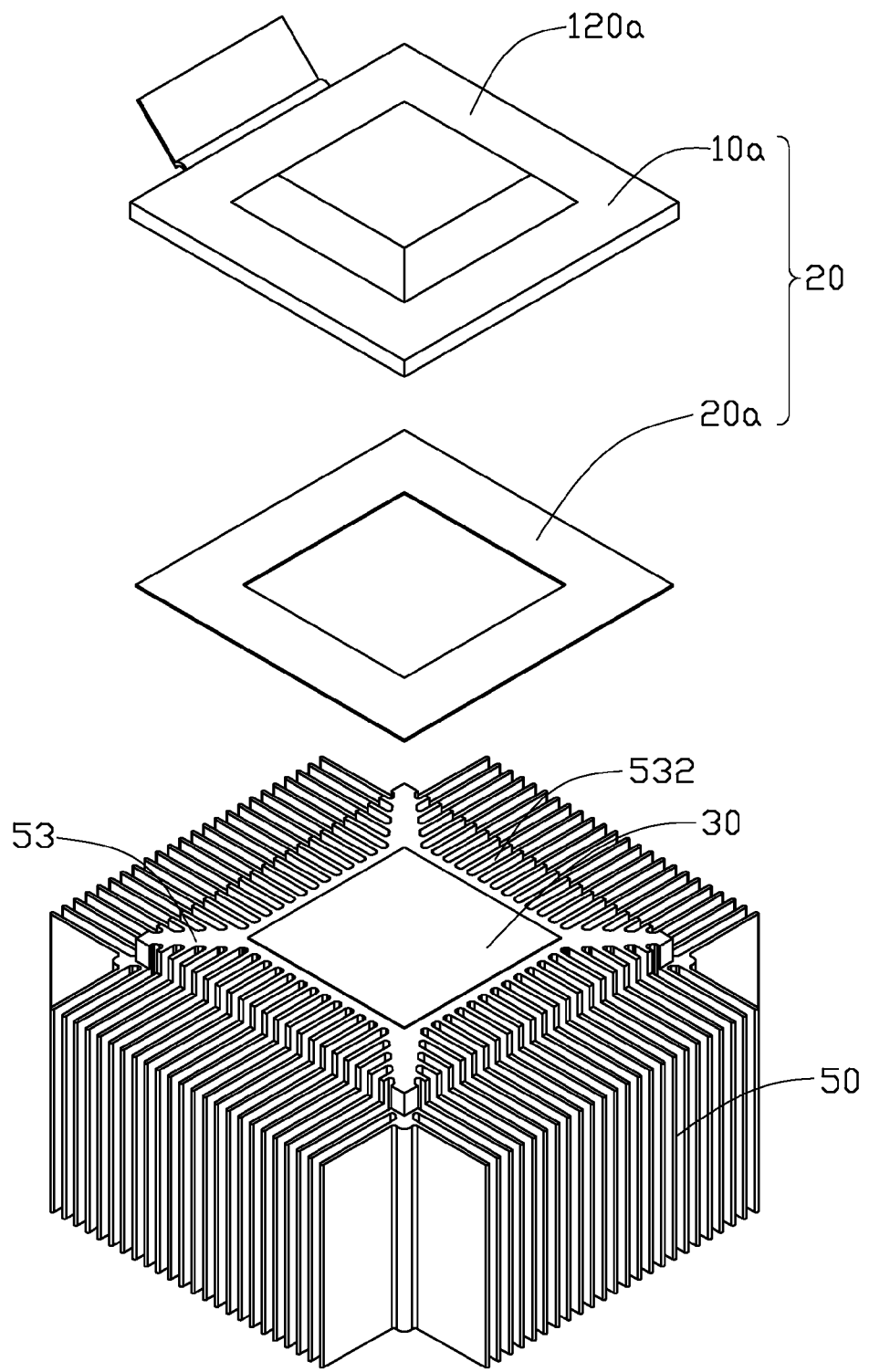
FIG. 4 is an isometric view of a protective device according to a second embodiment of the present invention, together with the heat sink and thermal interface material.
Figure 5:
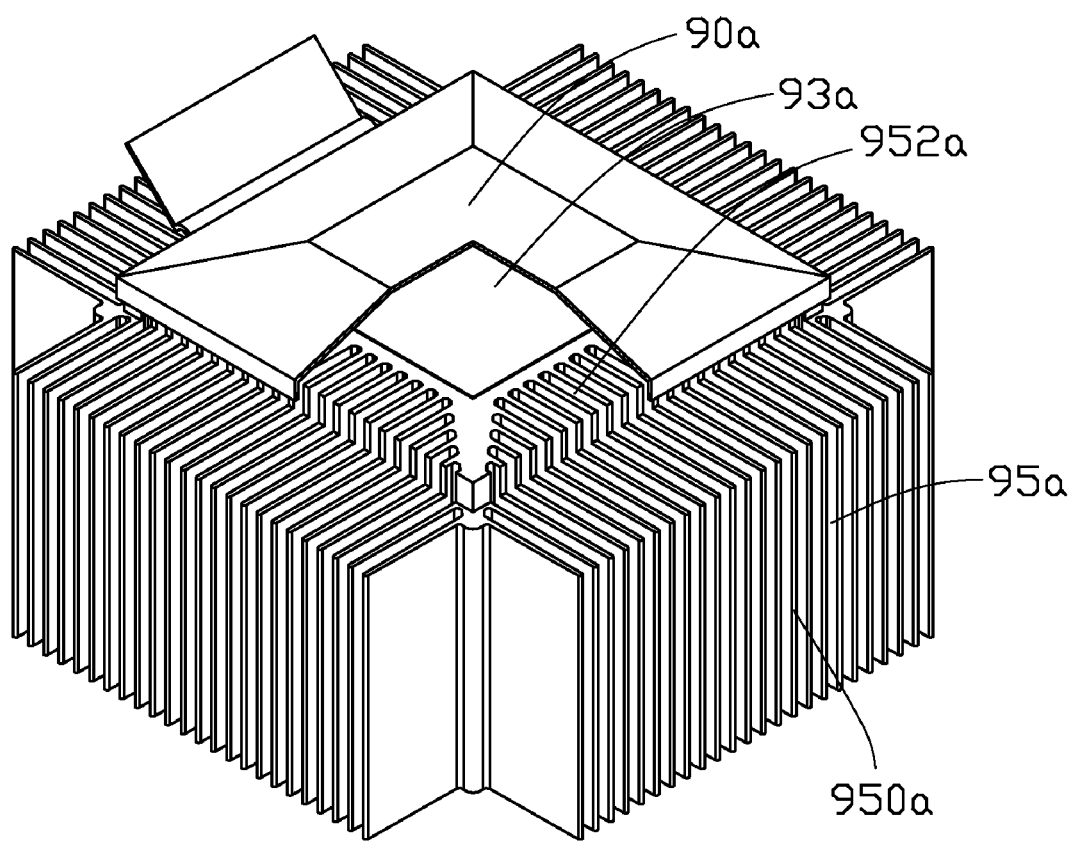
FIG. 5 is an assembled, isometric view of a related protective device and a heat sink, wherein the related protective device is partially cut away.

Referring to FIG. 4, a protective device 20 in accordance with a second embodiment of the present invention and the heat sink 50 are shown. The protective device 20 comprises a case 10a similar to the protective device 10 of the first preferred embodiment and an adhesive strap 20a between the case 10a and the heat sink 50. The adhesive strap 20a has a similar shape to the frame 120a of the case 10a and adhesive on top and bottom surfaces thereof. In assembly, the top surface of the adhesive strap 20a is attached to the peripheral surface 532 of the heat sink 50 and block portions of the air channels 552 through the platform 53, and the bottom surface of the adhesive strap 20a is attached to a top face of the frame 120a. Thus, the case 10a can be more firmly attached to the platform 53 of the heat sink 50 via the adhesive strap 20a. Furthermore, the flanges 16 of the protective device 10 of the first embodiment can be omitted from the case 10a in accordance with this embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly, comprising:
a heat sink having a bottom surface having a central portion and a peripheral portion, and a plurality of air channels through the peripheral portion of the bottom surface;
a thermal interface material spread on the central portion of the bottom surface of the heat sink; and
a protective device attached to a bottom of the heat sink and protecting the thermal interface material from being contaminated, comprising a case comprising an annular frame and a cap protruding downwardly from an inner edge of the frame;
wherein the cap is located corresponding to the thermal interface material and covers the thermal interface material, and the frame is attached to the heat sink around the thermal interface material, the frame blocking at least an inner portion of the air channels around the central portion of the bottom surface of the heat sink and preventing dust or foreign particles from contaminating the thermal interface material via the air channels.

2. The heat sink assembly as claimed in claim 1, wherein the frame of the case is quadrilateral and comprises four plane sides, and the cap comprises a board and four sloping walls respectively extending from inner edges of the plane sides, the sloping walls connecting with the board.

3. The heat sink assembly as claimed in claim 2, wherein four straight flanges respectively extend perpendicularly and upwardly from outside edges of the plane sides of the frame to engage with the heat sink.

4. The heat sink assembly as claimed in claim 1, wherein an adhesive is applied on a top surface of the frame of the case to adhere the frame to the bottom surface of the heat sink.

5. The heat sink assembly as claimed in claim 1, wherein the protective device further comprises an adhesive strap attached to a top surface of the frame, the adhesive strap has a configuration similar to that of the frame and has adhesive on both of top and bottom surfaces thereof.

6. The heat sink assembly as claimed in claim 1, wherein a tab extends outwardly from a side of the case and orients to a lateral side of the case.

7. A combination for dissipating heat generated by an electronic device, comprising:
a heat sink comprising a base adapted for contacting with the electronic device and thermal interface material applied onto a bottom surface of the base, a plurality of fins outwardly extending from peripheries of the base, an air channel extending vertically through every two adjacent fins;
a protective device disposed on a bottom of the heat sink and comprising an annular frame and a cap protruding downwardly from inside edges of the frame, wherein:
the cap covers the thermal interface material and the frame covers the fins around the thermal interface material and block the air channels to seal the thermal interface material from the air channels of the heat sink.

8. The combination as claimed in claim 7, wherein a quadrilateral platform protrudes on the bottom of the heat sink, and the protective device is attached to the platform.

9. The combination as claimed in claim 8, wherein the base has a shape of a square prism, the frame of the protective device is quadrilateral and comprises four plane sides, and the cap comprises a board and four sloping walls respectively extending from inside edges of the plane sides, the sloping walls connecting with the board.

10. The combination as claimed in claim 9, wherein four straight flanges respectively extend perpendicularly and upwardly from outside edges of the plane sides of the frame and engage with edges of the platform of the heat sink.

11. The combination as claimed in claim 7, wherein an adhesive is applied on a top surface of the frame of the protective device to adhere the frame to the bottom of the heat sink.

12. The combination as claimed in claim 7, wherein the protective device further comprises an adhesive strap attached to a top surface of the frame, the strap has a configuration similar to that of the frame and has adhesive on both of top and bottom surfaces thereof.

13. The combination as claimed in claim 7, wherein a tab extends outwardly from a side of the protective device and orients to a lateral side of the protective device.

14. A heat sink assembly comprising:
   a heat sink having a base and a plurality of fins extending outwardly from the base, air channels being defined between the fins and through a bottom of the heat sink around the base;
   thermal interface material applied to the bottom of the heat sink at the base;
      a protective device attached to the bottom of the heat sink and covering the thermal interface material thereby to protect the thermal interface material from contamination;
   wherein the protective device blocks portions of the air channels through the bottom of the heat sink and adjacent to the base, thereby to prevent dust and foreign particles from contaminating the thermal interface material through the air channels.

15. The heat sink assembly as claimed in claim 14, wherein the protective device comprises an annular frame attached to the bottom of the heat sink and blocking the portions of the air channels and a cap protruding downwardly from the frame, the thermal grease material being enclosed in the cap.

16. The heat sink assembly as claimed in claim 15, wherein the protective device further comprises a flange extending upwardly to engage with the heat sink.

17. The heat sink assembly as claimed in claim 16, wherein the protective device further comprises a tab extending outwardly from the flange, adapted for facilitating removal of the protective device from the heat sink.

18. The heat sink assembly as claim in claim 15, wherein adhesive is positioned between the frame and the bottom of the heat sink to adhere the protective device to the bottom of the heat sink.

* * * * *